United States Patent
Hanamoto et al.

[11] Patent Number: 5,291,038
[45] Date of Patent: Mar. 1, 1994

[54] REFLECTIVE TYPE PHOTOINTERRUPTER

[75] Inventors: Tetsuya Hanamoto, Nishinomiya; Masumi Nakamichi, Tenri; Masahiko Kimoto, Nara; Shohichi Kato, Yamatokoriyama; Shoichi Kondo, Nara, all of Japan

[73] Assignee: Sharp Kabushiki Kaisha, Osaka, Fed. Rep. of Germany

[21] Appl. No.: 808,857

[22] Filed: Dec. 18, 1991

[30] Foreign Application Priority Data

Dec. 19, 1990 [JP] Japan .................. 2-400965[U]
May 23, 1991 [JP] Japan ................... 3-118555
Jul. 22, 1991 [JP] Japan ................... 3-180902

[51] Int. Cl.⁵ ............... H01L 31/12; H01L 31/16
[52] U.S. Cl. ............................ 257/82; 257/81; 257/433; 257/435
[58] Field of Search ............... 257/80, 81, 82, 98, 257/99, 100, 433, 435, 434

[56] References Cited
FOREIGN PATENT DOCUMENTS

| 0394888 | 10/1990 | European Pat. Off. | 257/432 |
| 61-181175 | 8/1986 | Japan | 257/82 |
| 61-283179 | 12/1986 | Japan | 257/82 |
| 62-133774 | 6/1987 | Japan | 257/82 |
| 62-156882 | 7/1987 | Japan | 257/82 |
| 63-308392 | 12/1988 | Japan | 257/82 |
| 1-283883 | 11/1989 | Japan | 257/433 |
| 2-151083 | 6/1990 | Japan | 257/82 |

Primary Examiner—Rolf Hille
Assistant Examiner—Minhloan Tran
Attorney, Agent, or Firm—Nixon & Vanderhye

[57] ABSTRACT

A reflective type photointerrupter including: a resin case formed with a light emitting chip mounting recess and a light receiving chip mounting recess; a metallic deposit wiring formed in the recesses; and a light emitting chip and a light receiving chip respectively mounted on the light emitting chip mounting recess and the light receiving chip mounting recess and sealed with a resin material; the recesses being arranged in side-by-side relation and partitioned by an intermediate wall.

13 Claims, 14 Drawing Sheets

# REFLECTIVE TYPE PHOTOINTERRUPTER

FIELD OF THE INVENTION

The present invention relates to a photointerrupter (photosensor), and more particularly to a reflective type photointerrupter of the surface mounting type having a frameless structure in which wiring lines are constituted by metallic deposit covering a resin case, which photointerrupter is highly useful in various VTR devices, microcomputer controlling devices and the like.

DESCRIPTION OF THE RELATED ART

The conventional arts are is discussed with reference to FIGS. 25-27.

FIG. 25 is a sectional view schematically illustrating a conventional reflective type photointerrupter in which a light emitting chip 2 and a light receiving chip 3 are respectively mounted on metal lead frames 1,1, electrically connected thereto by means of wiring lines such as of gold, sealed with transparent plastic molds 4,4, and commonly molded with a light-shielding resin 5 having a high strength. The light shielding resin 5 serves to shield chips 2 and 3 from light from the other and exterior light and also form the overall shape of the photointerrupter.

In the above configuration, detection is performed in such a manner that light 6 emitted from the light emitting chip 2 is reflected by a surface reflector 8 of an external subject 7 to be detected and the reflected light 9 is received by the light receiving chip 3.

FIGS. 26 and 27 are respectively a plan view and a side view of the conventional reflective type photointerrupter shown in FIG. 25, in which a light projecting window 10 projects light emitted from the light emitting chip 2 and is sealed with the transparent resin 4 as in the above; a light incident window 11 is also sealed with the transparent resin 4; and the lead frames 1,1 are outwardly drawn from the opposite sides of the light-shielding resin 5.

With the above conventional reflective type photointerrupter, however, the chips 2 and 3 are mounted on the lead frames 1,1 and hence it is difficult to match thermal expansion coefficients between the metal lead frames 1,1 and the molding material (such as epoxy resin or thermoplastic resin which constitutes the transparent resin 4 or light-shielding resin 5). Further, if there is a reflow soldering process during surface mounting to another substrate, the heat resistance of the molding material needs to be improved for preventing peeling between the metal lead frames and the molding resin. (Refer to Japanese Unexamined Patent Publication No. 283883/1989).

SUMMARY OF THE INVENTION

The present invention has been accomplished in view of the above circumstances, and overcomes the problems of the conventional arts.

Thus, the present invention provides a reflective type photointerrupter comprising:

a resin case formed with a light emitting chip mounting recess and a light receiving chip mounting recess;

a metallic deposit wiring formed in said recesses; and a light emitting chip and a light receiving chip respectively mounted on said light emitting chip mounting recess and said light receiving chip mounting recess and sealed with a resin material;

said recesses being arranged in side-by-side relation and partitioned by an intermediate wall.

In the present invention, the metallic deposit wiring (metallic pattern) is formed in the recesses of the resin case instead of using a conventional metallic lead frame, thereby preventing peeling due to the difference in thermal expansion coefficient between the wiring and the sealing resin.

The metallic deposit wiring is preferably formed by plating or vapor-depositing a metal such as gold, silver or the like. It is also preferable to form a metallic deposit layer on both sides of the intermediate wall and to add a light-shielding admixture to a material constituting the resin case. Such an admixture may be a powder material such as of C, Si, InSb, an organic-type tonner or the like, and the metallic deposit layer can be formed from the same metallic material as used for the above metallic deposit wiring.

The material constituting the resin case is preferably a polymer liquid crystal having a high heat resistance and a high platability. Further, it is preferable to coat an open top surface of the resin case with a coating resin for preventing resin flow, and which coating resin may be added with the above light-shielding admixture.

As described above, the metallic deposit layer is formed on both sides of the intermediate wall and the light-shielding admixture is contained in the material constituting the resin case. Hence, light emitted from the light emitting chip and running toward the intermediate wall is reflected by the metallic deposit layer and never reaches the light receiving chip through the intermediate wall in contrast to the conventional arts. Further, the reflected light runs toward the opening, thereby efficiently utilizing light.

Further, if the light-shielding admixture is contained in the material constituting the resin case, light penetrating into the resin case through portions free of the metallic deposit layer is blocked by the light-shielding material and hence never reaches the light receiving chip. Furthermore, if the light-shielding admixture is added to the coating resin on the open top surface of the resin case, light expected to reach the light receiving chip through the coating resin can be blocked.

In addition, if the polymer liquid crystal having a high heat resistance and platability is used for forming the resin case, the device reliability can be improved.

As described above, according to the invention light leakage from the light emitting chip to the light receiving chip can be prevented, thus leading to improved signal/noise (S/N) ratio. Furthermore, the resin case having a high heat resistance and platability assures a highly reliable reflective type photointerrupter advantageously applicable in various VTR devices, microcomputer controlling devices and the like devices.

DETAILED DESCRIPTION OF THE PREFERRED EMBODIMENTS

Figure 1:
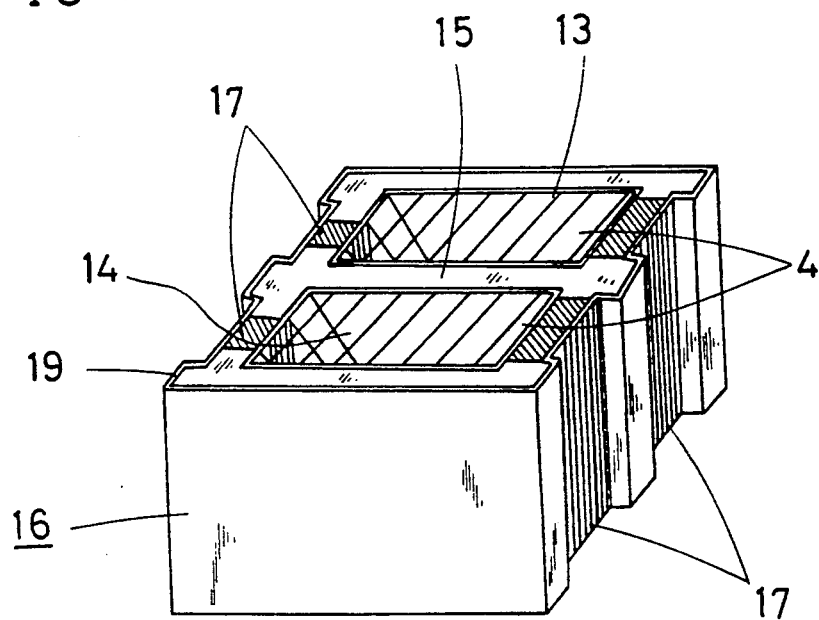
FIG. 1 is a perspective view illustrating a reflective type photointerrupter of frameless structure according to Embodiment 1 of the invention.
Figure 2:
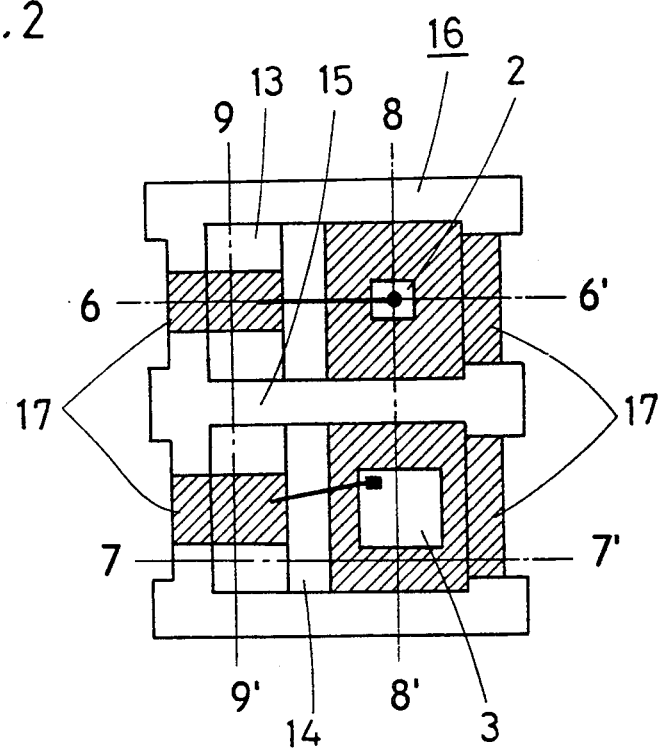
FIGS. 2 through 5 are respectively a plan view, front view, side view, and bottom view of the photointerrupter shown in FIG. 1.
Figure 3:
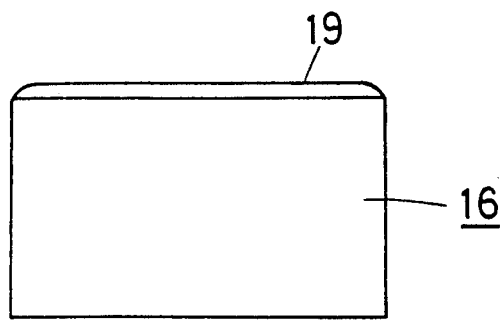
Figure 4:
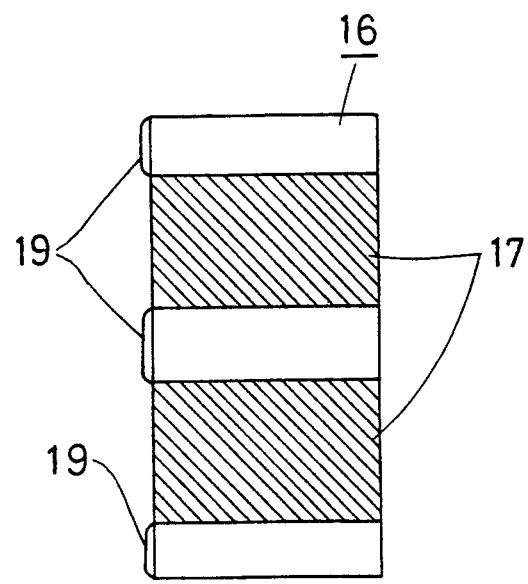
Figure 5:
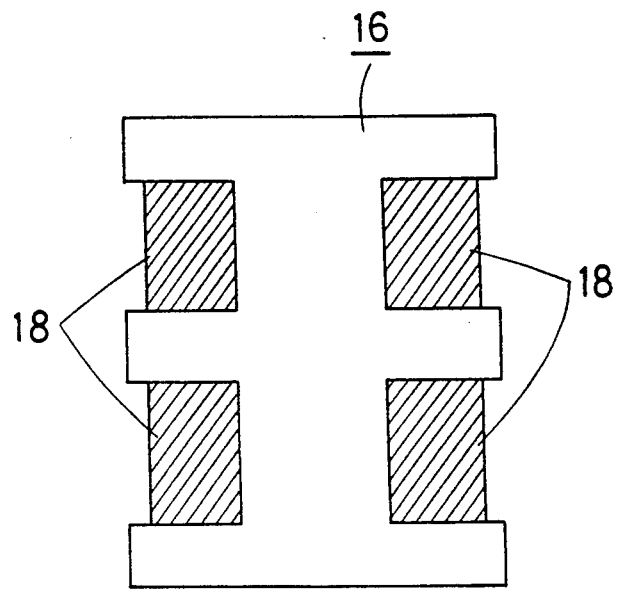
Figure 6:
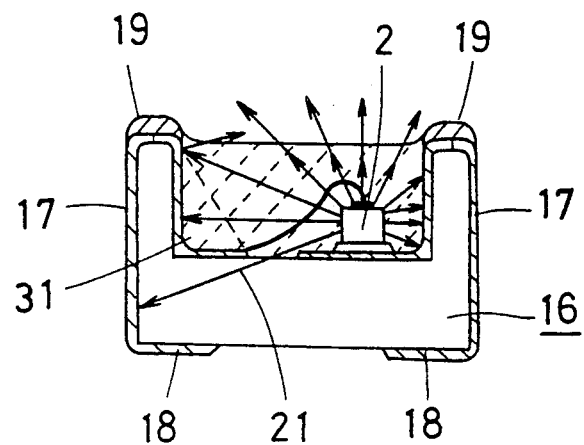
FIGS. 6 through 9 are sectional views of the photointerrupter taken respectively along 6—6', 7—7', 8—8' and 9—9' of FIG. 2.
Figure 7:
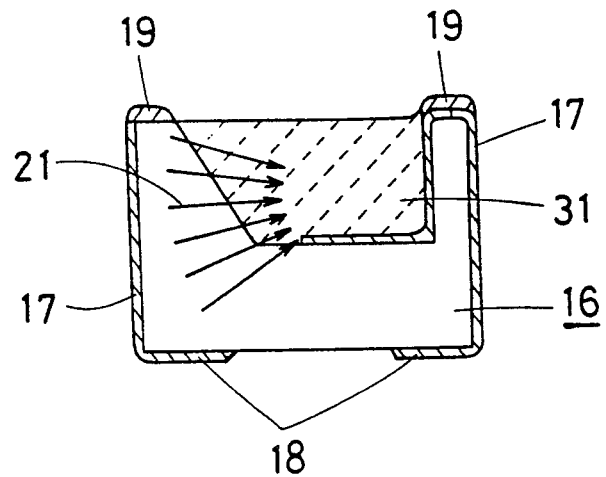
Figure 8:
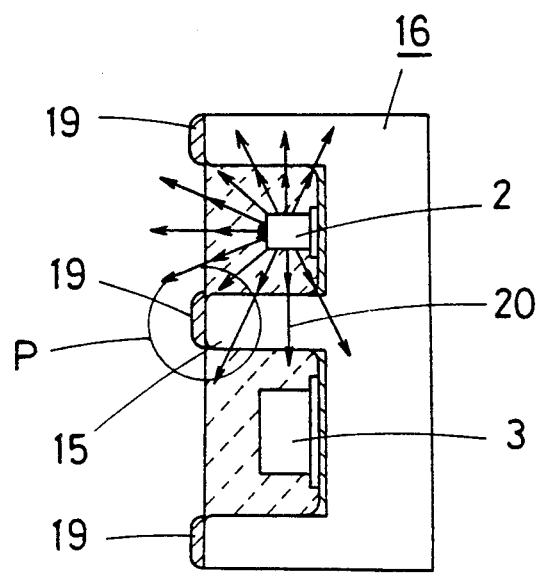
Figure 9:
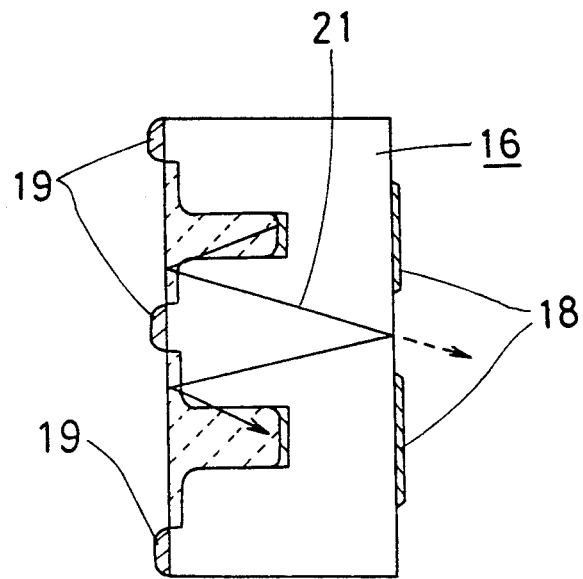
Figure 10:
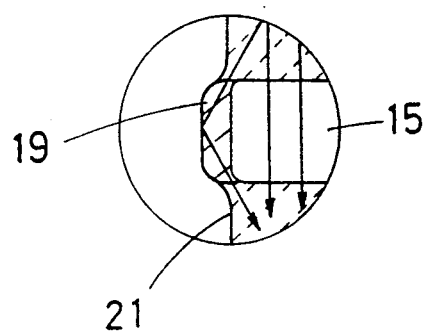
FIG. 10 is an enlarged view of a portion P in FIG. 8.

The preferred embodiments of the invention will now be described in greater detail with reference to the drawings.

Embodiment 1

Referring to FIGS. 1 through 10, a reflective type photointerrupter according to Embodiment 1 of the present invention comprises a resin case 16 formed with a light emitting chip mounting recess 13 for mounting a light emitting chip 2 and a light receiving chip mounting recess 14 for mounting a light receiving chip 3. The two recesses 13 and 14 are arranged in side-by-side relation and partitioned by an intermediate wall 15. Each of the recesses is formed with a metallic deposit wiring 17 such as of gold or silver using a plating or vapor deposition technique, whereby a frameless structure is realized. Such a reflection type photointerrupter can detect whether a subject to be detected is present or not without any contact.

Figure 12:
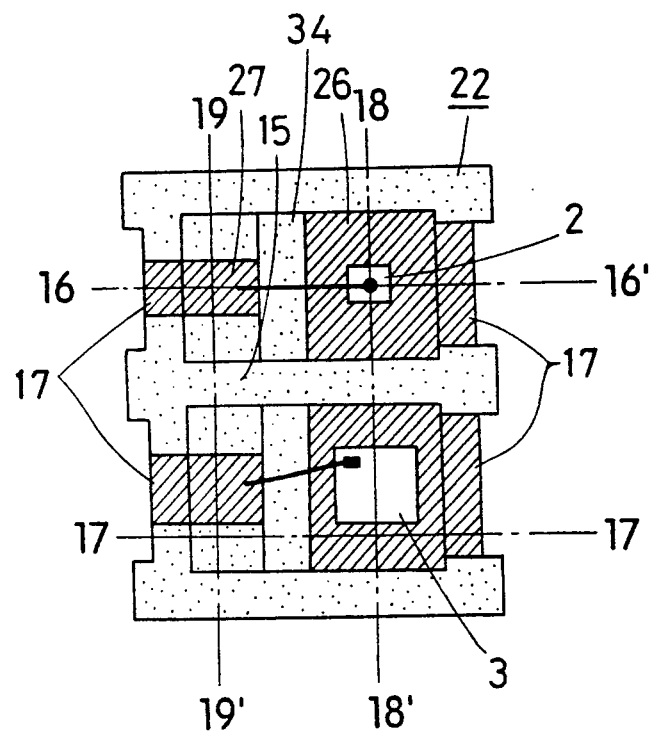
FIGS. 12 through 15 are respectively a plan view, front view, side view, and bottom view of the photointerrupter shown in FIG. 11.
Figure 13:
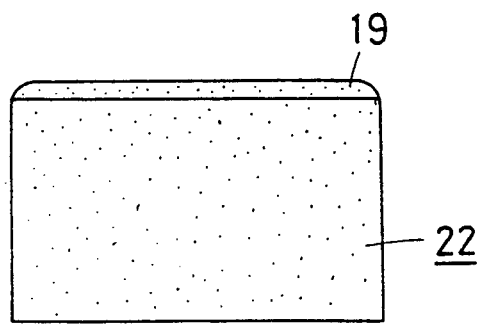
Figure 14:
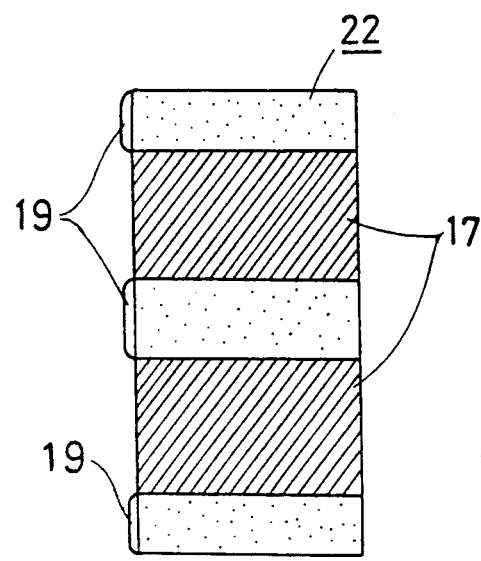

The metallic deposit wiring 17 extends along the outer surface of the resin case 16 and reaches the other side of the resin case 16 as shown in FIG. 12. The wiring 18 existing on the other side of the case serves as a soldering pad when this photointerrupter is mounted on another substrate.

The light emitting chip 2 and the light receiving chip 3 are respectively placed in the light emitting chip mounting recess 13 and light receiving chip mounting recess 14, each directly mounted on the metallic deposit wiring 17, and sealed with a transparent resin mold 31. During this sealing the resin mold 31 is possible to stick on the upper surface of the intermediate wall 15 or to spill to the exterior. To prevent this, a coating resin 19 for stopping resin flow is applied on the upper surface of the resin case 16 including the upper surface of the intermediate wall 15.

As described above, the present reflective type photointerrupter is of a frameless structure wherein an electrical wiring is formed by plating or vapor deposition of a metal instead of using a lead frame, and there is, therefore, no need to take into consideration the difference in thermal expansion coefficient between the metallic lead frame and the plastic mold material and deformation of a lead due to external force. Further, improvements can be made in heat resistance during reflow soldering and in thermal impulse resistance. In addition, since the metallic deposit wiring 17 reflects light, optical properties of the light emitting chip 2 and light receiving chip 3 are remarkably improved.

Embodiment 2

Figure 25:
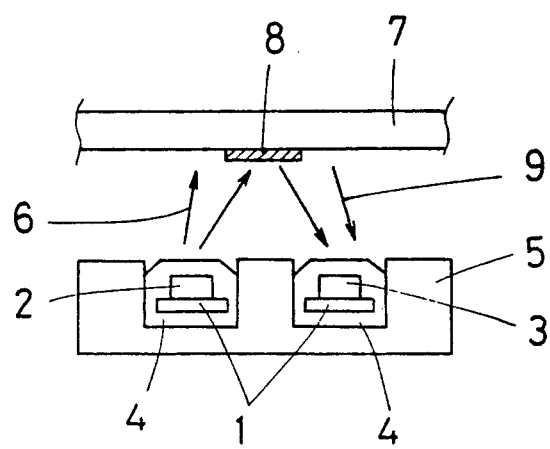
FIG. 25 is a sectional view for illustrating an operation of a conventional reflective type photointerrupter.
Figure 26:
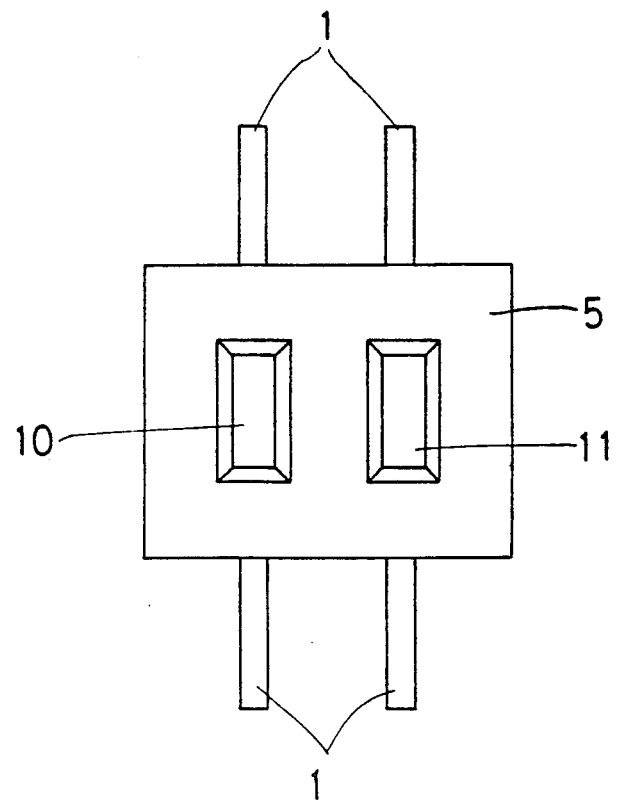
FIGS. 26 and 27 are respectively a plan view and side view illustrating a conventional reflective type photointerrupter.
Figure 27:
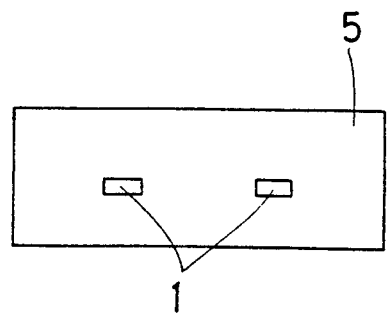

Embodiment 2 of the present invention is described with reference to FIGS. 11 through 23 in which like numerals designate like parts of the conventional photointerrupter shown in FIGS. 25-27.

Figure 11:
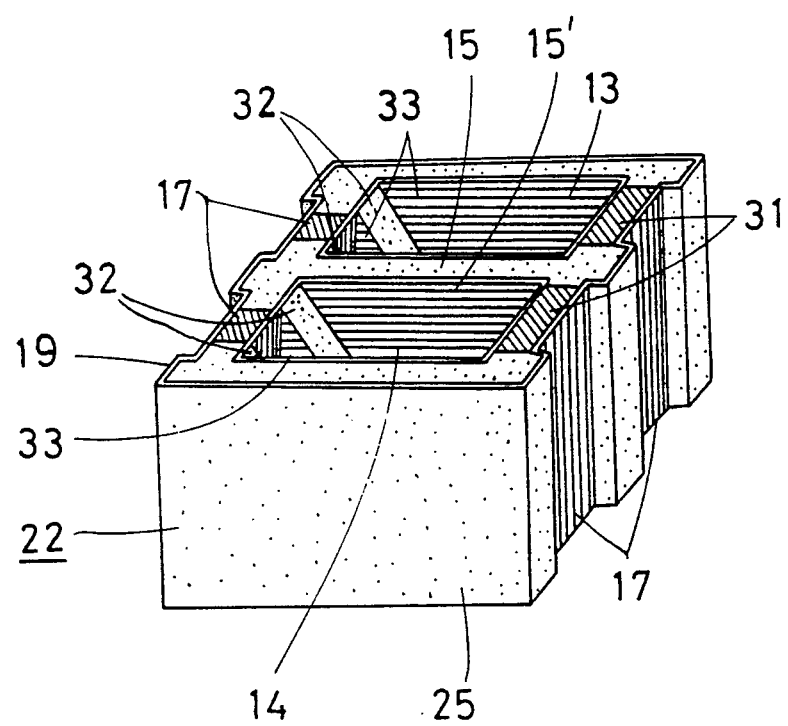
FIG. 11 is a perspective view illustrating a reflective type photointerrupter according to Embodiment 2 of the invention.

FIG. 11 shows a reflective type photointerrupter having a frameless structure according to Embodiment 2 wherein overall side faces of an intermediate wall are covered with a light shielding metallic deposit layer 15' of the same metallic material as a metallic deposit wiring 17; and a resin material of a resin case 22 and a coating resin 19 contain a light-shielding admixture 25. In such a photointerrupter, light emitted from a light emitting chip 2 will never leak toward a light receiving chip 3 through the intermediate wall. Further, since the light-shielding admixture 25 is contained in the material constituting the resin case 22, light penetrating into the resin case through portions free of the metallic deposit layer 15' and metallic deposit wiring 17 is blocked by the light-shielding admixture 25 and hence never leaks toward the light receiving chip 3. Furthermore, since the light-shielding admixture 25 is also contained in the coating resin 19, light leakage from the light emitting chip 2 to the light receiving chip 3 through the coating resin 19 can be blocked.

As the material constituting the resin case 22, an engineering plastic such as polymer liquid crystals, polyether sulfone or the like is used. Such an engineering plastic has high processability and heat resistance and therefore serves to enhance the reliability of the reflective type photointerrupter. The engineering plastic, however, is essentially a translucent material and therefore insufficient for light shielding. For this reason the light-shielding admixture 25 is contained in the engineering plastic as described above, and at the same time the light-shielding metallic deposit layer 15' is formed on side faces of the intermediate wall, whereby sufficient light shielding between the light emitting and receiving chips can be realized. In particular, the polymer crystal is practically useful because it is excellent in platability and heat resistance while being inexpensive as compared with other engineering plastics.

It is worthy of note that the resin case 22 is colored black due to the light-shielding admixture 25 and hence absorbs heat radiation well. Accordingly, the resin case 22 is entirely and uniformly heated in a short time during reflow soldering, thereby minimizing thermal stress due to the difference in temperature distribution.

Now, the present reflective type photointerrupter is more fully described following the fabrication process.

Figure 21:
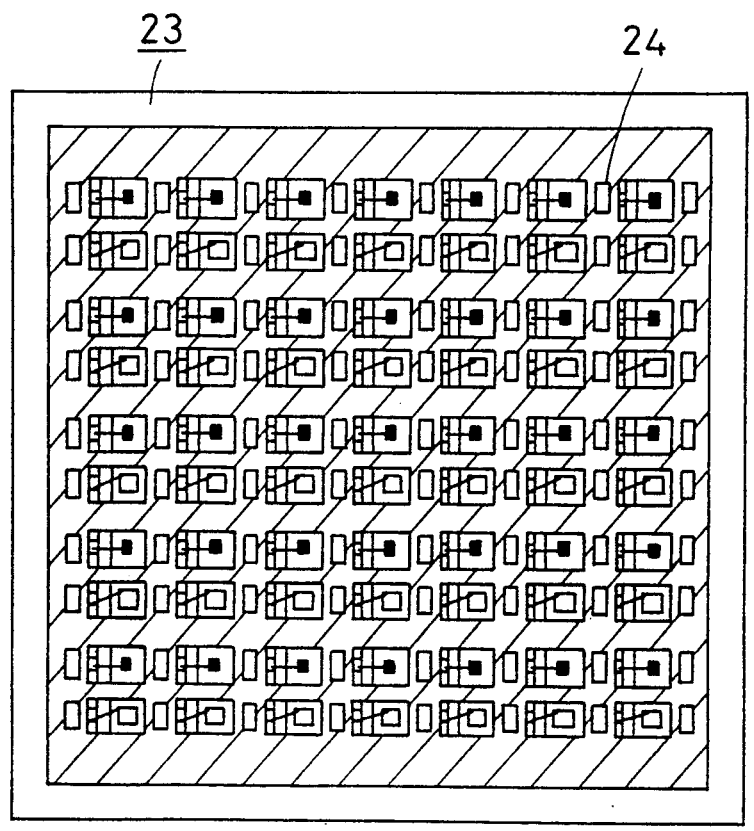
FIGS. 21 and 22 are respectively a plan view and bottom view illustrating reflective type photointerrupters according to Embodiment 2 which are arranged on a seat board.
Figure 22:
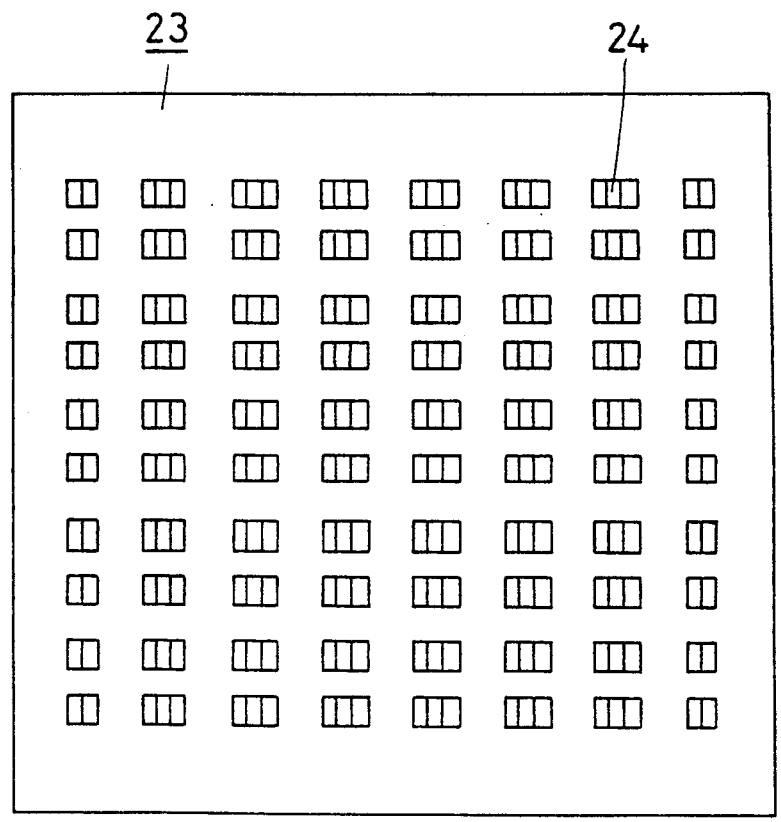

As shown in FIGS. 12-20, the resin case 22 is first formed. Practically, a sheet substrate arranged with many resin cases is fabricated as shown in FIGS. 21 and 22 in which the reference numeral 24 designates a through hole. However, a single resin case 22 is discussed here.

The resin case 22 is formed by injection-molding an engineering plastic, for example, polymer liquid crystal or polyether sulfone having good platability and heat resistance against soldering. For improving the light shielding properties of the engineering plastic, added thereto is a powdery admixture 25 of, for example, C, Si, InSb, an oranic tonner or the like. Sufficient light shielding effect can be obtained by selecting the amount of the admixture 25 to be added and particle size thereof. For instance, the amount and particle size of C are 0.5–5.0 wt. % and 1.0 μm or smaller in diameter, respectively. When the amount is less than 0.5 wt. %, sufficient light shielding effect cannot be given to the resin case 22, while when it exceeds 5.0 wt. %, the platability of the resin case 22 degrades. Further, larger than 1.0 μm of particle size results in easy transmission of light between particles, leading to insufficient light shielding effect.

Next, a metallic deposit film (such as of Cu, Ni, Au or the like) is formed over the resin case 22 by electroless plating, electrolytic plating, vapor deposition or the like technique, followed by etching or like process to three-dimensionally form the metallic deposit wiring 17 including a chip-land pad 26 and an electrode pad 27. The wiring 17 on the outer surface of the resin case 22 is formed by plating the through hole 24.

At the same time with the metallic deposit wiring 17, the light-shielding layer 15' is formed on both side faces of the intermediate wall 15 entirely. Further, the entire inner wall of the resin case 22 including slope portions 32 constituting the light emitting chip mounting recess 13 and light receiving chip mounting recess 14 is covered with a reflective metallic deposit layer 33. Thereafter, the reflective metallic deposit layer on the slope portions 32 is removed by photoetching. In this photoetching process the inclination of the slope portions 32 allows easy selective exposure.

The metallic deposit wiring 17 is extended to the other side of the resin case 22 to serve as soldering pads 18,18. The soldering pads 18,18 are of the same shape and area and disposed symmetrically as shown in FIG. 15, and hence prevent manhattan phenomenon during reflow soldering for mounting to a substrate.

Figure 15:
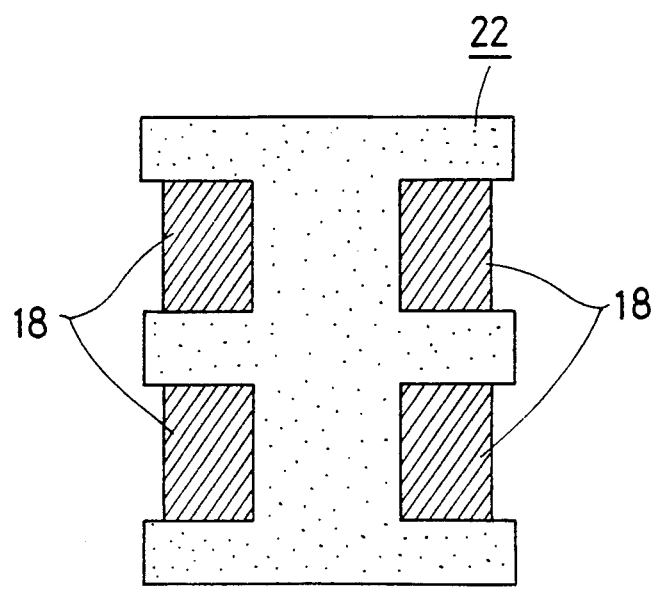

A deposit-free portion (insulating portion) shown in FIG. 15 needs to be large enough to prevent short circuit due to solder projection during soldering for mounting to a substrate. The slope portions 32 as well as a portion 34 between the chip-land pad 26 and electrode pad 27 are also deposit free and whereat the high heat-resistant resin material is left exposed to serve as an insulator to constitute a three-dimensional insulating line.

The light-shielding metallic deposit layer 15' on the intermediate wall 15 needs to have 0.5 μm thick or more to be given sufficient light shielding properties.

In turn, the top surface of the resin case 22 including the top surface of the intermediate wall 15 is covered with the coating resin 19 mainly composed of an epoxy resin or a like resin in order to prevent adherence of a transparent resin 31 to be described later to the top surface of the intermediate wall 15 and overflow thereof to the exterior. The coating resin 19 includes the powdery admixture 25 such as of C, Si, InSb, an organic-type tonner or the like as with the resin material of the resin case 22. Sufficient light shielding effect can be obtained by selecting the amount of the admixture 25 to be added and particle size thereof. For instance, the amount and particle size of C are 0.5–5.0 wt. % and 1.0 μm or smaller in diameter, respectively. When the amount is less than 0.5 wt. %, sufficient light shielding effect cannot be given to the coating resin 19, while when it exceeds 5.0 wt. %, the printing property of the coating resin 19 degrades. Further, larger than 1.0 μm of particle size results in easy transmission of light between particles, leading to insufficient light shielding effect.

Subsequently, the light emitting chip 2 and light receiving chip 3 are respectively die-bonded to the chip-land pads 26,26 with silver paste or the like. Electrodes of the chips are wire-bonded to respective electrode pads 27,27 with gold wires. Thereafter, each of the chips 2 and 3 is sealed with plastic mold of a high light-transmissive organic resin 31 for potting such as of epoxy resin or the like.

It should be noted that the following problems arise in the case where the coating resin does not sufficiently repel the organic resin 31 for potting The resin 31 injected into the resin case 22 shrinks to decrease in volume when cured, so that it possibly comes to have a recessed configuration. Such a recessed configuration serves as a concave lens to diffuse light from the light emitting chip 2, causing luminance degradation. Likewise, light running toward the light receiving chip 3 is also diffused by the recessed configuration to lower the light intensity. To prevent the resin 31 from recessing, it is desirable to inject a larger amount of the resin 31 than needed to compensate for the shrinkage. Although the use of, for example, a high viscosity resin in a proper amount enables to form a convexed configuration when just injected into the resin case 22 by virtue of a large surface tension thereof, great decrease in viscosity due to elevated temperature for curing causes the resin to overflow eventually. For overcoming this problem, there may be used a sort of resin maintaining a high viscosity at even an elevated temperature which will not cause overflow at curing. This case involves a problem of long injection time due to too high viscosity, resulting in lowered productivity as well as a problem of catching air bubbles during injection, leading to degraded reliability.

Accordingly, it is preferable to select a combination of the sealing resin with the coating resin, for example, a combination of an epoxy type sealing resin with a silicone-type coating resin. Since the silicone-type resin repels the epoxy-type resin, even if the sealing resin 31 is injected in an excess amount by 10–30% to compensate for shrinkage or due to error of an injection apparatus, the sealing resin 31 of the epoxy-type resin will not overflow, whereby the surface of the sealing resin 31 having cured can be made coplanar with the top face of the resin case or convexed therefrom.

In this embodiment a heat-curing epoxy resin is used as the sealing resin and a silicone resin as the coating resin. But the invention does not intend to limit to such a combination provided that the coating resin 19 repels the sealing resin 31. For instance, the silicone-type resin may be used as the sealing resin 31 while the epoxy resin as the coating resin 19.

As initially described, up to the sealing process the reflective type photointerrupters according to Embodiment 2 are arranged on a sheet substrate 23.

Finally, a multiplicity of photointerrupters arranged on the sheet substrate are separated from each other by cutting through-holes 24 using a diamond blade dicing saw to complete a surface mounting type photointerrupter of frameless structure.

Figure 24:
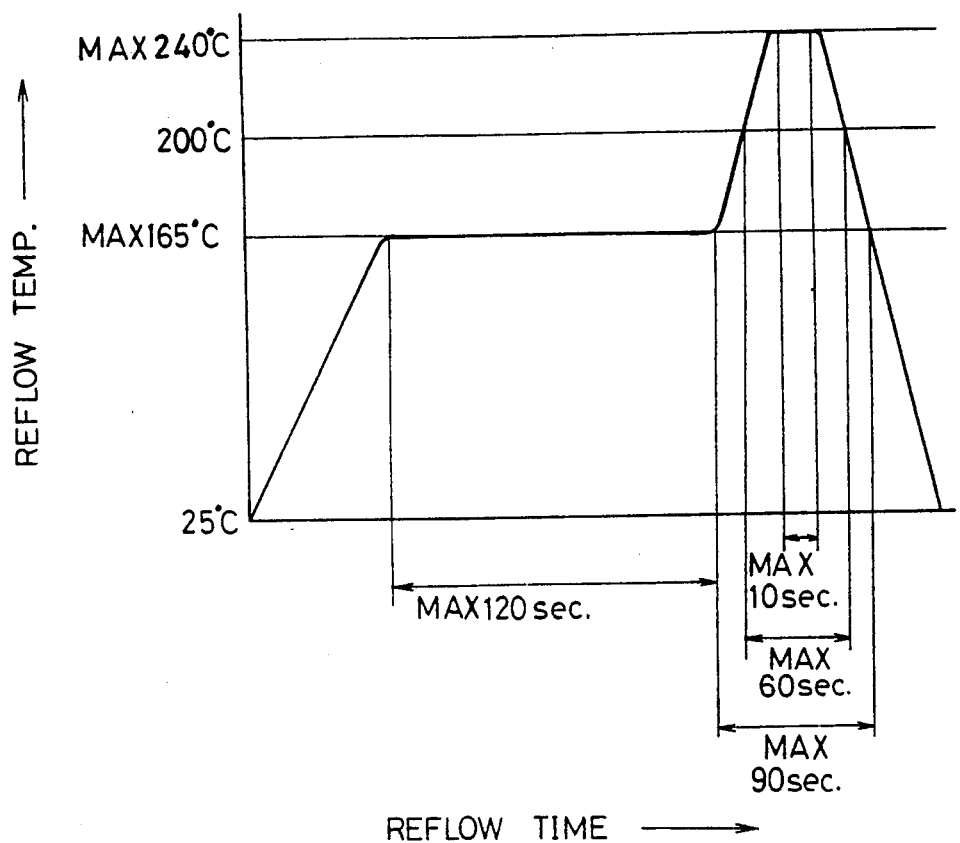
FIG. 24 is a profile of reflow soldering during surface mounting of a typical photointerrupter on a substrate.

FIG. 24 is a typical temperature profile of reflow soldering for surface mounting to a substrate. As can be understood from the profile, the reflow temperature reaches 240° C. at maximum. To prevent deformation of the resin case 22 due to such an elevated temperature, there is needed to select an engineering plastic having a heat deformation point of 200° C. or above. Such a plastic will not deform even if the reflow temperature reaches 240° C. so long as external force is not added thereto. The polymer liquid crystals or polyether sulfone meets this requirement and have good heat resistance, and is therefore suitable in the invention.

Further, it is worthy of note that the resin case 22 is colored black due to the light-shielding admixture 25 and hence absorbs heat radiation well. Accordingly, the resin case is entirely and uniformly heated in a short time during reflow soldering, thereby minimizing thermal stress due to the difference in temperature distribution. Therefore, the stress does not exert on the interface 33 between the resin case 22 and the metallic deposit layer 15'.

In the photointerrupter according to the present Embodiment 2 the light-shielding metallic deposit layer 15' entirely covers both of the side faces of the intermediate wall 15. Hence, light emitted from the light emitting chip 2 is reflected by the metallic deposit layer 15' and never penetrate into the resin case 22, thereby overcoming the conventional problem of light leakage from the light emitting chip 2 to the light receiving chip 3 through the intermediate wall 15. Further, most of light emitted from the light emitting chip 2 is reflected by the reflective deposit layer 33 as well as by the light-shielding metallic deposit layer 15' and projected from the upper opening, thus enhancing the light utilization efficiency by about the half or more as compared with conventional photointerrupter.

Figure 16:
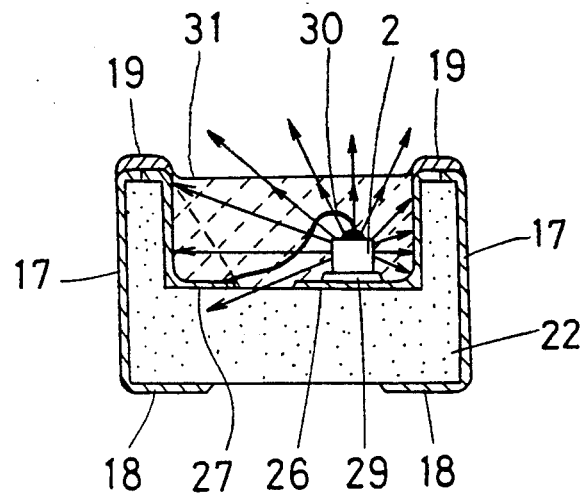
FIGS. 16 through 19 are sectional views of the photointerrupter taken respectively along 16—16', 17—17', 18—18' and 17—17' of FIG. 12.
Figure 17:
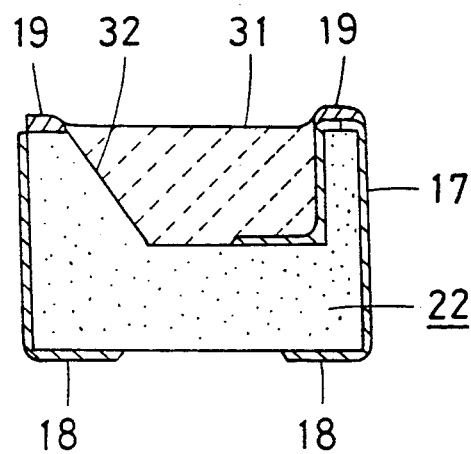
Figure 18:
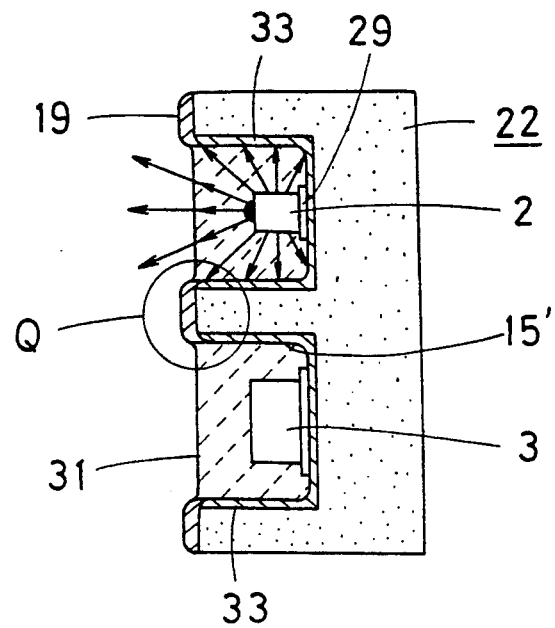
Figure 19:
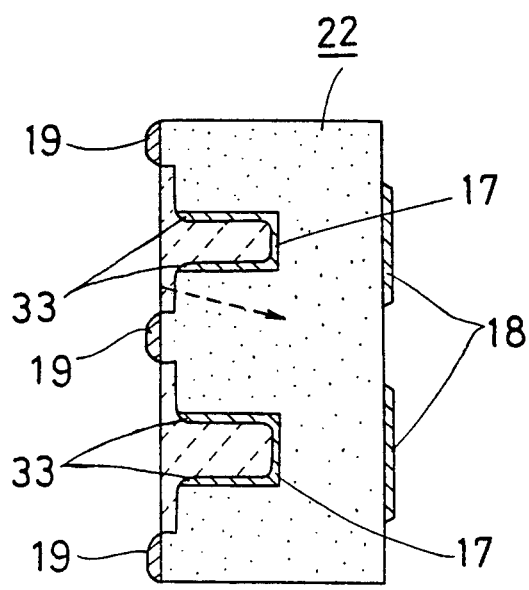

Further, since the light-shielding admixture 25 is included in the resin material of the resin case 22, even if light emitted from, for example, a GaAs infrared red ray emitting diode ($\lambda p = 940$ nm) penetrates into the resin case 22, the light-shielding admixture 25 absorbs light as shown in FIGS. 16 and 19 to prevent light from transmitting the resin case 22, thereby inhibiting outward light leakage therethrough. Accordingly, besides the light leakage directly reaching to the light receiving chip 3 through the resin case 22, light leaked toward the exterior and serving as disturbance to the light receiving chip 3 in the conventional art can be prevented.

Figure 20:
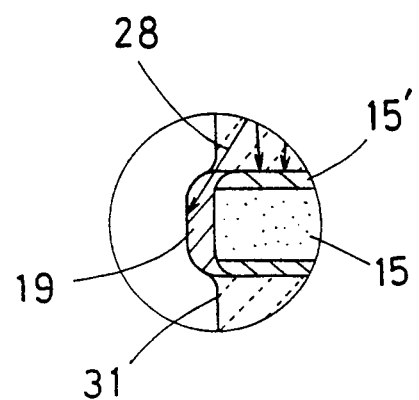
FIG. 20 is an enlarged view of a portion Q in FIG. 18.

Furthermore, since the light-shielding admixture 25 is included in the coating resin 19, even if light emitted from, for example, a GaAs infrared red ray emitting diode ($\lambda p = 940$ nm) penetrates into the coating resin 19 on the upper surface of the intermediate wall 15, the light-shielding admixture 25 absorbs light as shown in FIG. 20 to prevent light from leaking toward the light receiving chip 3 through the coating resin 19.

The following Table 1 shows actual leakage current values of respective samples of the reflective type photointerrupter according to Embodiment 2.

TABLE 1

| Sample No. | Leakage Current Value (A) |
|---|---|
| 1 | $3.0 \times 10^{-10}$ |
| 2 | $5.0 \times 10^{-10}$ |
| 3 | $3.0 \times 10^{-10}$ |
| 4 | $4.0 \times 10^{-10}$ |
| 5 | $5.0 \times 10^{-10}$ |
| 6 | $4.0 \times 10^{-10}$ |
| 7 | $1.0 \times 10^{-10}$ |
| 8 | $4.0 \times 10^{-10}$ |
| 9 | $5.0 \times 10^{-10}$ |

TABLE 1-continued

| Sample No. | Leakage Current Value (A) |
|---|---|
| 10 | $7.0 \times 10^{-9}$ |

As can be understood from Table 1, the leakage current value is smaller than $10^{-9}$ A and is equivalent to a typical dark current of a chip. Thus, according to Embodiment 2 of the invention about $10^{-4}$ of leakage current, which value is essential to the conventional photointerrupter, can be mitigated as low as $10^{-9}$ or less to improve in S/N ratio, leading to highly reliable reflective type photointerrupter.

Although the present embodiment provides such means as (1) covering entirely the side faces of the intermediate wall 15 with the light-shielding metallic deposit layer 15' as well as including the light-shielding admixture 25 in the material of resin case 22, and (2) including the light-shielding admixture 25 in the coating resin 25, for preventing light leakage between the chips, the means (2) may be omitted. Where the above two means are not provided, the leakage current reaches the order of about $10^{-4}$ A, while where the means (1) is provided, the leakage current can be mitigated as low as the order of about $10^{-7} - 10^{-6}$ A. When the means (2) is further provided, the leakage current on the order of $10^{-9}$ A as shown in Table 2 can be attained.

It should be noted that a provision of merely the light-shielding metallic deposit layer 15' over the side faces of the intermediate wall 15 mitigates the leakage current as low as about $10^{-5}$ A order. To mitigate the leakage current as low as possible, however, it is desirable to provide the means (1) or a combination of the means (1) and (2)

Embodiment 3

Figure 23:
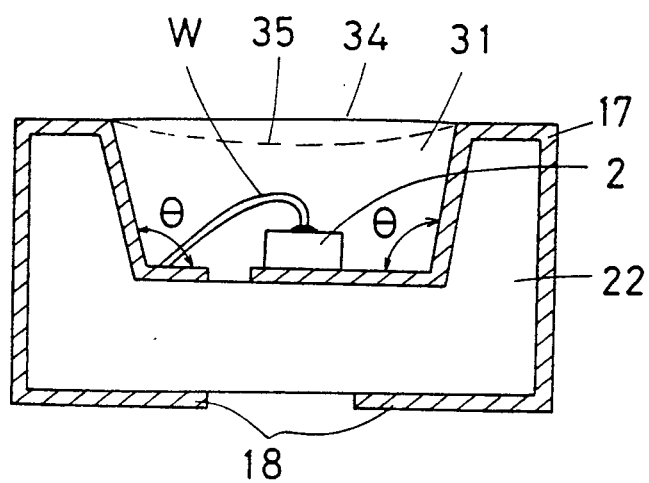
FIG. 23 is a sectional view illustrating a reflective type photointerrupter according to Embodiment 3 of the invention.

FIG. 23 is a sectional view showing a reflective type photointerrupter according to Embodiment 3 of the invention, wherein like numerals designate like parts of Embodiment 2 and W designates a bonding wire (25-30 $\mu$m in diameter). Since Embodiment 3 is a partial modification of Embodiment 2, only a different part is to be described.

As shown in FIG. 23, the reflective type photointerrupter according to Embodiment 3 is not provided with a coating resin 19 on the top surface of a resin case 22 shown, for example, in FIG. 16. An organic resin 31 for potting is injected so as to have a surface coplanar with or slightly concaved from the top surface of the resin case 22 as indicated by a reference numeral 34 or 35. Since Embodiment 3 is not provided with the coating resin 19, light leakage therethrough can be prevented.

Further, inner side walls of the resin case 22, along which a metallic deposit wiring 17 is formed, are outwardly inclined at angle of, for example, 90-135° C. to thereby enhancing the utilization efficiency of light rather than Embodiment 2.

While only certain presently preferred embodiments have been described in detail, as will be apparent with those familiar with the art that various changes and modifications can be made without departing from the scope of the invention as defined by the following claims.

What is claimed is:

1. A reflective type photointerrupter including a light emitting chip and a light receiving chip for emitting light to hit an object and for receiving reflected light, said photointerrupter comprising:
- a leadless resin case formed with an emitting chip recess for mounting the light emitting chip and a receiving chip recess for mounting the light receiving chip, the case having an intermediate wall which separates the two recesses, the two recesses being formed whereby the two chips are positioned side-by-side across the intermediate wall;
- metallic deposit wirings formed to cover a partial area of each recess and extended to run over a top face, side face, and bottom face of the resin case, wherein the emitting chip and the receiving chip are each placed in the respective recesses to rest on the metallic deposit wirings, and sealed with a transparent resin.

2. A reflective type photointerrupter as set forth in claim 1, wherein the intermediate wall has two side faces which are each covered with a metal deposit for shielding light, and the resin case is manufactured from a material which is mixed with an additive for shielding light.

3. A reflective type photointerrupter as set forth in claim 2, wherein said additive is mixed in an amount of 0.5-5.0 wt. % with said material constituting the resin case.

4. A reflective type photointerrupter as set forth in claim 2, wherein a top surface of said resin case is coated with a coating resin mixed with said additive.

5. A reflective type photointerrupter as set forth in claim 4, wherein said light-shielding admixture is mixed in an amount of 0.5-5.0 wt. % with said coating resin.

6. A reflective type photointerrupter as set forth in claim 2, wherein said additive is a powdery material comprising an element selected from a group consisting of carbon, silicon, indium antimonide and an organic-type toner.

7. A reflective type photointerrupter as set forth in claim 6, wherein said powdery material comprises carbon particles having a diameter of 1.0 μm or less.

8. A reflective type photointerrupter as set forth in claim 2, wherein said metallic deposit wiring is a plated element selected from a group consisting of plating gold, copper, nickel and silver.

9. A reflective type photointerrupter as set forth in claim 2, wherein said metallic deposit wiring is a vapor-deposition of an element selected form a group consisting of gold, copper, nickel, and silver.

10. A reflective type photointerrupter as set forth in claim 1, wherein said resin case is made of an engineering polymer selected from polymer liquid crystals an polyether sulfone.

11. A reflective type photointerrupter as set forth in claim 1, wherein said metallic deposit wiring is a plated element selected from a group consisting of gold, copper, nickel and silver.

12. A reflective type photointerrupter as set forth in claim 1, wherein said metallic deposit wiring is a vapor-deposition of an element selected from a group consisting of gold, copper, nickel, and silver.

13. A reflective type photointerrupter as set forth in claim 1, wherein at least one of the chips is sealed with a combination of a sealing resin and a coating resin, wherein the coating resin is the same resin used for coating the top face of the resin case.

* * * * *